US007919573B2

(12) United States Patent
Li et al.

(10) Patent No.: US 7,919,573 B2
(45) Date of Patent: Apr. 5, 2011

(54) POLYMER HAVING THIENO[3,2-B] THIOPHENE MOIETIES

(75) Inventors: Yuning Li, Mississauga (CA); Ping Liu, Mississauga (CA); Yiliang Wu, Mississauga (CA); Beng S. Ong, Mississauga (CA)

(73) Assignee: Xerox Corporation, Norwalk, CT (US)

( * ) Notice: Subject to any disclaimer, the term of this patent is extended or adjusted under 35 U.S.C. 154(b) by 766 days.

(21) Appl. No.: 11/280,119

(22) Filed: Nov. 16, 2005

(65) Prior Publication Data

US 2007/0112171 A1 May 17, 2007

(51) Int. Cl.
*C08G 75/06* (2006.01)
*C08G 75/00* (2006.01)

(52) U.S. Cl. ........................................ 528/377; 528/373

(58) Field of Classification Search .................. 528/373, 528/377

See application file for complete search history.

(56) References Cited

FOREIGN PATENT DOCUMENTS

EP 1 510 535 A1 3/2005

OTHER PUBLICATIONS

Bekmann et al; Copolymer having adamantyl and dye chains; BASF A.G. Germany; 1997, Chem Abstract 126: 173016.*

Wiesenfeldt et al; Polymers—nonlinear optics; BASF A.G. Germany; 1993; Chem Abstract 119: 162372.*

Martin Heeney et al., "Stable Polythiophene Semiconductors Incorporating Thieno[2,3-b]thiophene," *J. Am. Chem. Soc.*, vol. 127, No. 4, pp. 1078-1079 (published on web Jan. 7, 2005).

H. E. Katz et al., "Synthetic Chemistry for Ultrapure, Processable, and High-Mobility Organic Transistor Semiconductors," *Acc. Chem. Res.*, vol. 34, No. 5, pp. 359-369 (2001).

Christos D. Dimitrakopoulos et al., "Organic Thin Film Transistors for Large Area Electronics," *Adv. Mater.*, vol. 14, No. 2, pp. 99-117 (2002).

D. R. Rutherford et al., "Poly(2,5-ethynylenethiophenediylethynylenes), Related Heteroaromatic Analogues, and Poly(thieno[3,2-b]thiophenes). Synthesis and Thermal and Electrical Properties," *Macromolecules*, vol. 25, No. 9, pp. 2294-2306 (1992).

Xinnan Zhang et al., "Alkyl-Substituted Thieno[3,2-b] thiophene Polymers and Their Dimeric Subunits," *Macromolecules*, vol. 37, pp. 6306-6315 (published on web Jul. 30, 2004).

* cited by examiner

*Primary Examiner* — Duc Truong
(74) *Attorney, Agent, or Firm* — Fay Sharpe LLP

(57) ABSTRACT

A polymer comprising one or more types of repeat units, wherein the polymer includes a substituted thieno[3,2-b] thiophene component A and a different component B in the same type of repeat unit or in different types of repeat units, and wherein the polymer excludes a substituted or unsubstituted thieno[2,3-b]thiophene moiety. The polymer can be used as a semiconductor in electronics such as in organic thin film transistors.

13 Claims, 2 Drawing Sheets

POLYMER HAVING THIENO[3,2-B] THIOPHENE MOIETIES

This invention was made with United States Government support under Cooperative Agreement No. 70NANBOH3033 awarded by the National Institute of Standards and Technology (NIST). The United States Government has certain rights in the invention.

BACKGROUND OF THE INVENTION

Organic electronics has been an intense research topic over the last two decades or so because of their enormous commercial potential. Some illustrative organic electronic devices are diodes, organic thin film transistors, and organic photovoltaics. One of the key components in these devices is the organic semiconductor which has received extensive research and development efforts. In the field of organic electronics, organic thin film transistors (OTFTs) have in recent years attracted great attention as low-cost alternatives to mainstream amorphous silicon-based transistors for electronic applications. OTFTs are particularly suited for applications where large-area circuits (e.g., backplane electronics for large displays), desirable form factors and structural features (e.g., flexibility for electronic paper), and affordability (e.g., ultra low cost for ubiquitous radio frequency identification tags) are essential.

Organic p-channel semiconductors are typically based on: (1) acenes such as tetracene, pentacene and their derivatives, (2) thiophenes such as oligothiophenes and polythiophenes, (3) fused-ring thiophene-aromatics and thiophene-vinylene/arylene derivatives. Most of these semiconductors are either insoluble or are sensitive to air, and may not be suitable for low-cost OTFT applications. Therefore, there is a need addressed by embodiments of the present invention to develop new organic semiconductors that can be processed in air for manufacturing low-cost OTFTs.

The following documents provide background information:

Martin Heeney et al., EP 1510535 A1.

Martin Heeney et al., "Stable Polythiophene Semiconductors Incorporating Thieno[2,3-b]thiophene," *J. Am. Chem. Soc.*, Vol. 127, No. 4, pp. 1078-1079 (published on web Jan. 7, 2005).

H. E. Katz et al., "Synthetic Chemistry for Ultrapure, Processable, and High-Mobility Organic Transistor Semiconductors," *Acc. Chem. Res.*, Vol. 34, No. 5, pp. 359-369 (2001).

Christos D. Dimitrakopoulos et al., "Organic Thin Film Transistors for Large Area Electronics," *Adv. Mater.*, Vol. 14, No. 2, pp. 99-117 (2002).

D. R. Rutherford et al., "Poly(2,5-ethynylenethiophenediylethynylenes), Related Heteroaromatic Analogues, and Poly(thieno[3,2-b]thiophenes). Synthesis and Thermal and Electrical Properties," *Macromolecules*, Vol. 25, No. 9, pp. 2294-2306 (1992).

Xinnan Zhang et al., "Alkyl-Substituted Thieno[3,2-b] thiophene Polymers and Their Dimeric Subunits," *Macromolecules*, Vol. 37, pp. 6306-6315 (published on web Jul. 30, 2004).

SUMMARY OF THE DISCLOSURE

The present invention is accomplished in embodiments by providing a polymer comprising one or more types of repeat units, wherein the polymer comprises a substituted thieno[3,2-b]thiophene component A and a different component B in the same type of repeat unit or in different types of repeat units, and wherein the polymer excludes a substituted or unsubstituted thieno[2,3-b]thiophene moiety.

In other embodiments, there is provided an electronic device comprising a polymer comprising one or more types of repeat units, wherein the polymer comprises a substituted thieno[3,2-b]thiophene component A and a different component B in the same type of repeat unit or in different types of repeat units, and wherein the polymer excludes a substituted or unsubstituted thieno[2,3-b]thiophene moiety.

In additional embodiments, there is provided a thin film transistor comprising: a semiconductor layer including a polymer comprising one or more types of repeat units, wherein the polymer comprises a substituted thieno[3,2-b] thiophene component A and a different component B in the same repeat unit type or in different repeat unit types, and wherein the polymer excludes a substituted or unsubstituted thieno[2,3-b]thiophene moiety.

BRIEF DESCRIPTION OF THE DRAWINGS

Other aspects of the present invention will become apparent as the following description proceeds and upon reference to the following figures which are representative embodiments.

Unless otherwise noted, the same reference numeral in different Figures refers to the same or similar feature.

DETAILED DESCRIPTION

Figure 1:
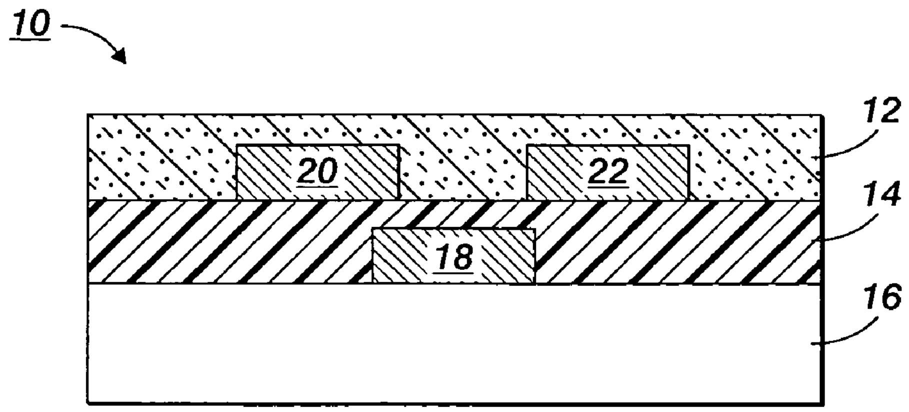
FIG. 1 represents a first embodiment of the present invention in the form of an OTFT.

The present polymer comprises one or more types of repeat units, wherein the polymer comprises a substituted thieno[3,2-b]thiophene component A and another different component B in the same type of repeat unit or in different types of repeat units, and wherein the polymer excludes a substituted or unsubstituted thieno[2,3-b]thiophene moiety. That the substituted thieno[3,2-b]thiophene component A is substituted, as compared with an unsubstituted thieno[3,2-b]thiophene moiety, may provide in embodiments (depending on the particular substituent(s)) a number of benefits for the polymer such as for instance one or more of the following: enhanced solubility (or processability) and improved molecular ordering.

In embodiments, the repeat unit is the fundamental recurring unit of a polymer. The connection of the repeat units in the polymer may be identical, as in the case of a regioregular polymer, or may be not identical, as in the case of a regiorandom polymer, with respect to directional sense. Whether a repeat unit A is considered the same type or a different type as another repeat unit B is independent of directional sense when repeat unit A and repeat unit B are in the polymer. For instance, regiorandom poly(3-hexyl thiophene) is considered to have only one type of repeat unit. As another example, Xinnan Zhang et al., "Alkyl-Substituted Thieno[3,2-b] thiophene Polymers and Their Dimeric Subunits," *Macromolecules*, Vol. 37, pp. 6306-6315 (published on web Jul. 30, 2004), disclose a regiorandom poly(3-alkylthieno[3,2-b] thiophene) which is considered to have only one type of repeat unit.

In embodiments, the substituted thieno[3,2-b]thiophene component A is of formula (I):

(I)

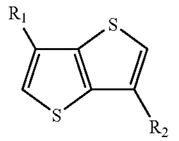

wherein one of $R_1$ and $R_2$ is hydrogen and the other is a substituent, or both $R_1$ and $R_2$ are the same or different substituent, wherein the substituent is independently selected from the group consisting of an optionally substituted hydrocarbon group, a heteroatom-containing group, and a halogen. In embodiments of formula (I), $R_1$ and $R_2$ are independently selected from alkyl, alkylaryl, arylalkyl, alkoxy, and alkoxyalkyl groups which have for example from one to about 50 carbon atoms.

The component B, which is different from component A, can be dissimilar in any manner such as for example an unsubstituted thieno[3,2-b]thiophene, a non-thieno[3,2-b]thiophene based structure, or a substituted thieno[3,2-b]thiophene having different type and/or number of substituents.

The polymer may be for example a homopolymer or a copolymer, wherein, for each type of repeat unit, the number of repeat units may be from for example 2 to about 5000, particularly from about 10 to about 2000.

The polymer may be used for any suitable applications. In embodiments, the polymer may be used as a semiconductor for electronic devices such as for example diodes, thin film transistors, and photovoltaics.

In embodiments, component B, which may be conjugated or non-conjugated, is selected from the group consisting of (i) the following conjugated structural units which are optionally substituted:

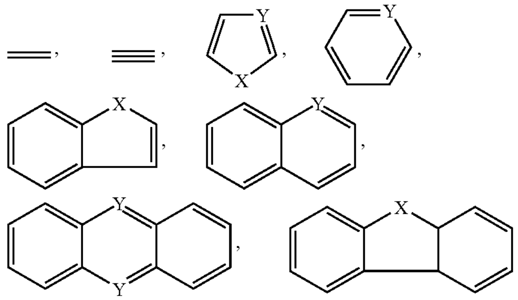

and/or (ii) the following non-conjugated structural units:

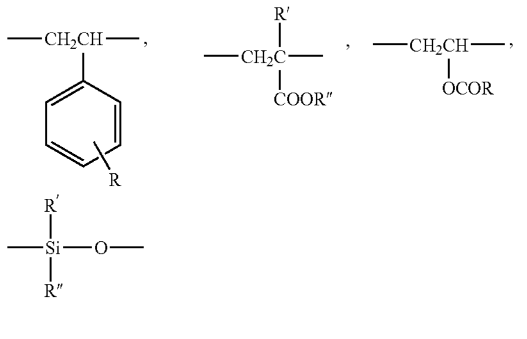

wherein X is selected from the group consisting of C(R'R"), O, S, Se, NR, and Si(R'R"), and wherein R, R', and R" are independently selected from the group consisting of an optionally substituted hydrocarbon group, a heteroatom-containing group, and a halogen; and Y is a carbon atom or a nitrogen atom.

The term "conjugated" refers to the unsaturated nature of the backbone structure in which double or triple bonds are present; it is understood that any optional substituent(s) on the backbone structure(s) may or may not be "conjugated."

In embodiments, component B may be a thieno[3,2-b]thiophene of formula (II):

(II)

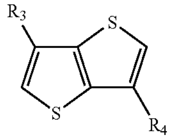

wherein $R_3$ and $R_4$ are the same or different from each other and are independently selected from the group consisting of a hydrogen atom, an optionally substituted hydrocarbon group, a heteroatom-containing group, and a halogen. In embodiments of formula (II), $R_3$ and $R_4$ are independently selected from alkyl, alkylaryl, arylalkyl, alkoxy, and alkoxyalkyl groups which have for example from one to about 50 carbon atoms.

In embodiments, component A and component B are present in the same type of repeat unit, and the polymer can be selected for example from the group of consisting of polymers (1) through (29):

(1)

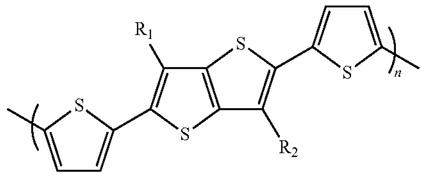

(2)

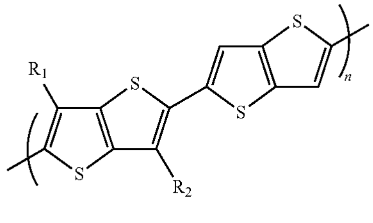

(3)

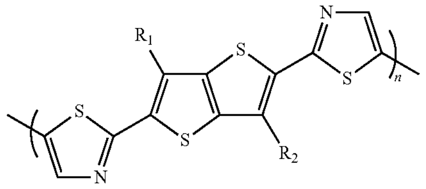

-continued
(4)
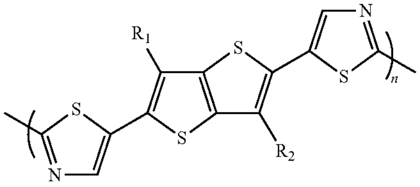
(5)
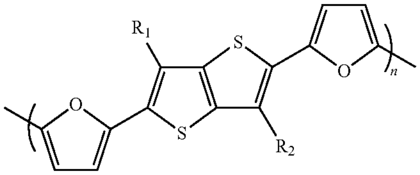
(6)
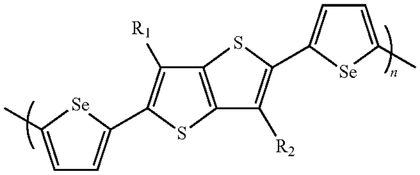
(7)
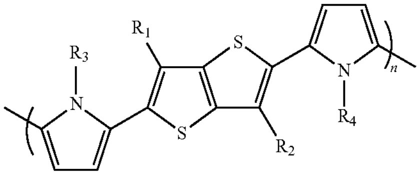
(8)
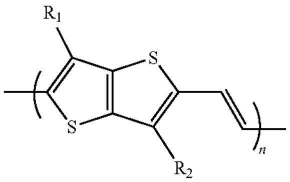
(9)
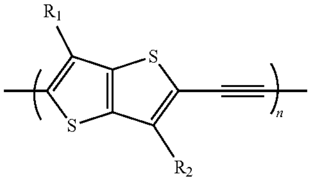
(10)
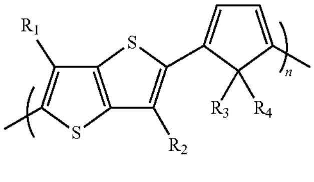
(11)
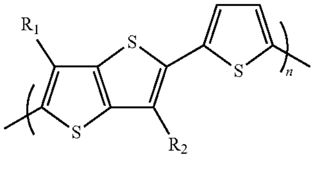
-continued
(12)
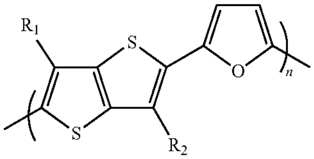
(13)
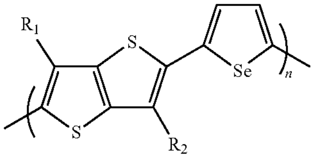
(14)
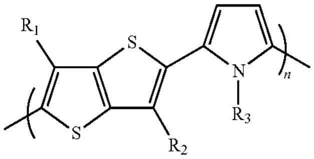
(15)
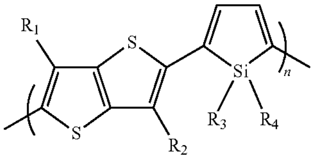
(16)
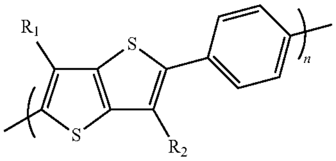
(17)
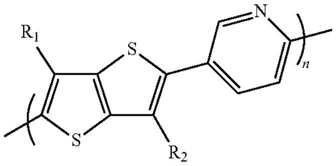
(18)
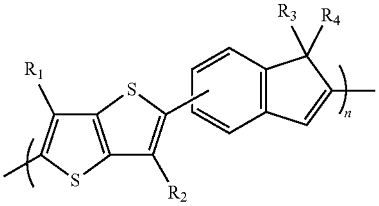
(19)
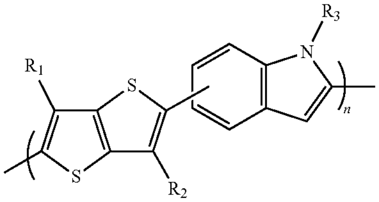
(20)
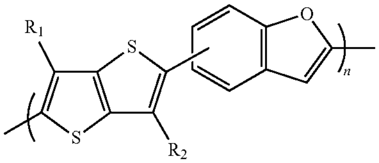

-continued (21)

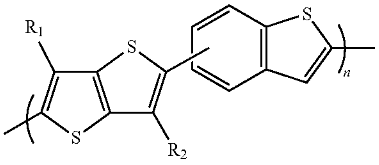

(22)

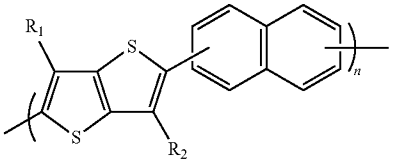

(23)

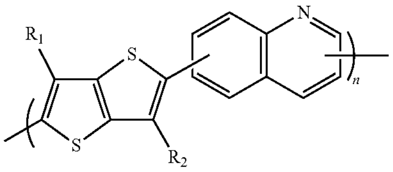

(24)

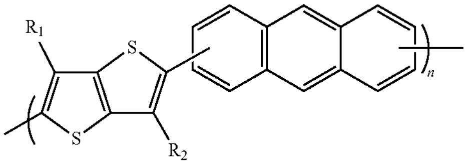

(25)

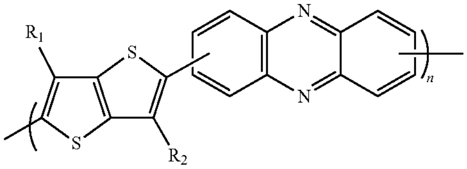

(26)

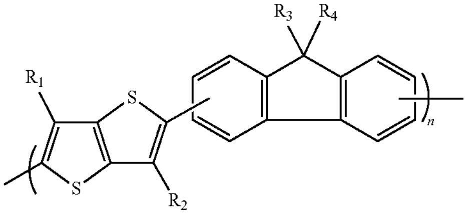

(27)

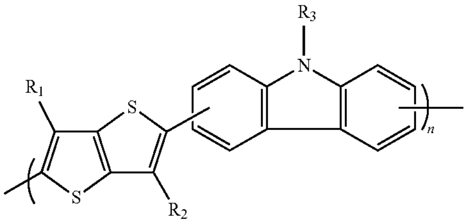

(28)

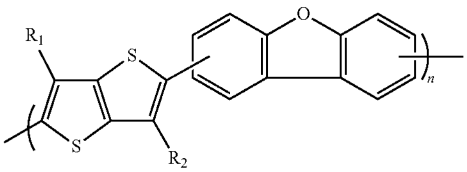

-continued (29)

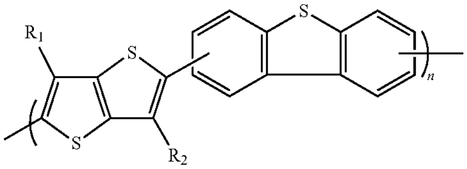

and a mixture thereof, wherein n is the number of repeat units in the polymer such as for example 2 to about 5000; and wherein one of $R_1$ and $R_2$ is hydrogen and the other is a substituent, or both $R_1$ and $R_2$ are the same or different substituents, and wherein the substituent is independently selected from the group consisting of an optionally substituted hydrocarbon group, a heteroatom-containing group, and a halogen; and wherein $R_3$ and $R_4$ is the same or different from each other and are independently selected from the group consisting of a hydrogen atom, an optionally substituted hydrocarbon group, a heteroatom-containing group, and a halogen.

In embodiments of the present polymer such as for instance polymers (1), (3), and (4) through (7), the polymer also contain a component C which can be the same or different from component B. In embodiments, there is generally no preference in assigning the labels "component" and "component C" to particular structures. For example, in polymer (1), either depicted thienylene moiety can be viewed as component B and the other thienylene moiety can be viewed as component C.

In embodiments, the present polymer can be selected from the group consisting of polymers (1) through (7), particularly polymer (1) and polymer (2), and a mixture thereof.

In embodiments, the present polymer is a block polymer which is selected for example from the representative group consisting of polymers (30) through (35):

(30)

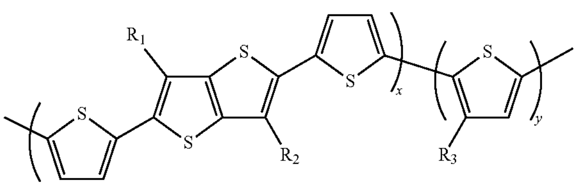

(31)

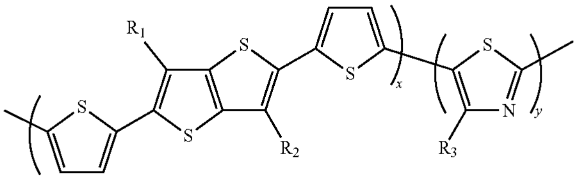

(32)

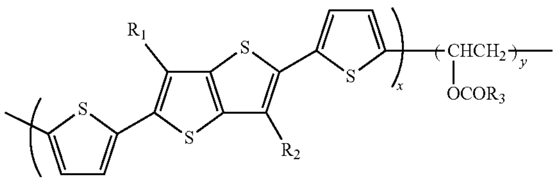

-continued (33)

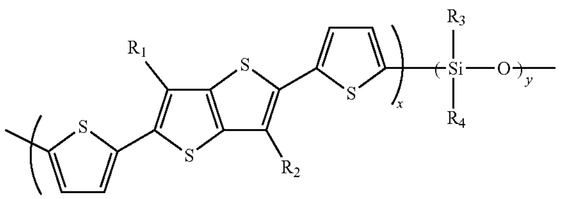

(34)

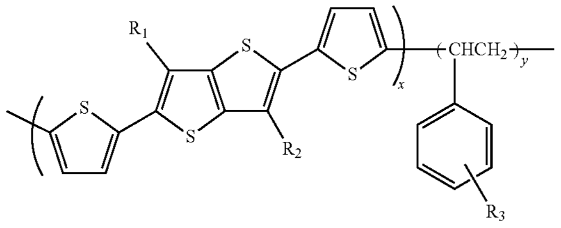

(35)

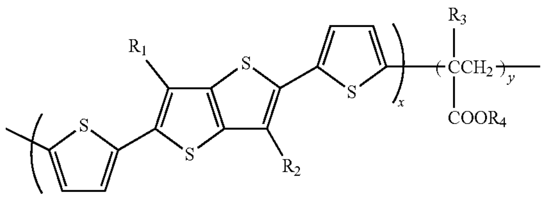

and a mixture thereof, wherein x and y are the number of repeat units in the respective blocks and are the same or different from each other, wherein x and y are for example 2 to about 5000; and wherein one of $R_1$ and $R_2$ is hydrogen and the other is a substituent, or both $R_1$ and $R_2$ are the same or different substituent, and wherein the substituent is independently selected from the group consisting of an optionally substituted hydrocarbon group, a heteroatom-containing group, and a halogen; and wherein $R_3$ and $R_4$ is the same or different from each other and are independently selected from the group consisting of a hydrogen atom, an optionally substituted hydrocarbon group, a heteroatom-containing group, and a halogen.

In embodiments of the block polymer such as for example polymers (30) through (35), component B can be in the same block as component A or in a different block. In embodiments such as for example polymers (30) through (35), the polymer also contain a component C and a component D which can be the same or different from component B. In embodiments, there is generally no preference in assigning the labels "component B," "component C," and "component D" to particular structures. For example, in polymer (30), any of the three depicted thienylene moieties in the two blocks can be viewed as component B and the other two depicted thienylene moieties can be viewed as component C and component D.

The terms "optionally substituted hydrocarbon group," "heteroatom-containing group," and "halogen" are used herein for describing certain aspects of various embodiments of for example, component A, component B, and the polymer. Unless otherwise noted, the representative examples discussed herein for the terms ("optionally substituted hydrocarbon group," "heteroatom-containing group," and "halogen" ) apply whenever that particular term is used. For instance, the representative examples of the "heteroatom-containing group" apply to component A and component B since the discussion of component A and component B also refers to the term "heteroatom-containing group."

Any suitable optionally substituted hydrocarbon group can be used. The optionally substituted hydrocarbon group contains for example from 1 to about 50 carbon atoms, or from 4 to about 20 carbon atoms, and may be for example a straight chain alkyl group, a branched alkyl group, a cycloalkyl group, an aryl group, an alkylaryl group, and an arylalkyl group. Representative hydrocarbon groups include for example methyl, ethyl, propyl, butyl, pentyl, hexyl, heptyl, octyl, nonyl, decyl, undecyl, dodecyl, tridecyl, tetradecyl, pentadecyl, hexadecyl, heptadecyl, octadecyl, cyclopentyl, cyclohexyl, cycloheptyl, and isomers thereof.

The hydrocarbon group is optionally substituted one or more times with for example a halogen (chlorine, bromine, fluorine, and iodine) or a heteroatom-containing group described herein, or a mixture thereof.

Any suitable heteroatom-containing group can be used. The heteroatom containing group has for example 2 to about 120 atoms, or from 2 to about 80 atoms, and may be for example a nitrogen containing moiety, an alkoxy group, a heterocyclic system, an alkoxyaryl, and an arylalkoxy. Representative heteroatom-containing groups include for example cyano, nitro, methoxyl, ethoxyl, and propoxy.

Any suitable halogen can be used. The halogen may be chlorine, bromine, fluorine, and iodine.

In embodiments of the polymer, $R_1$, $R_2$, $R_3$ and $R_4$ are the same or different from each other. In embodiments of the polymer, one, two or more of $R_1$, $R_2$, $R_3$ and $R_4$ are independently selected, optionally substituted hydrocarbon groups, particularly optionally substituted hydrocarbon groups having from 1 to about 50 carbon atoms. In particular embodiments, one, two or more of $R_1$, $R_2$, $R_3$ and $R_4$ are independently selected from the group consisting of methyl, methoxy, ethyl, ethynyl, ethoxy, propyl, propynyl, propoxy, butyl, butynyl, butoxy, pentyl, pentynyl, pentoxy, hexyl, hexynyl, hexyloxy, heptyl, heptynyl, heptloxy, octyl, octynyl, octyloxy, nonyl, nonynyl, nonyloxy, decyl, decynyl, decyloxy, undecyl, undecynyl, undecyloxy, dodecyl, dodecynyl, dodecyloxy, tridecyl, tridecynyl, tridecyloxy, pentadecyl, pentadecynyl, pentadecyloxy, hexadecyl, hexadecynyl, hexadecyloxy, heptadecyl, heptadecynyl, heptadecyloxy, octadecyl, octadecynyl, octadecyloxy, nonadecyl, nonadecynyl, nonadecyloxy, eicosanyl, eicosanynyl, and eicosanyloxy, and the like.

In embodiments, the present polymer can be, for example, prepared by copolymerizing a monomer comprising component A and a monomer comprising component B, or by polymerizing a monomer comprising both component A and component B. Representative synthesis of substituted thieno[3,2-b]thiophene and the present polymer are outlined in Scheme 1 through Scheme 3. For example, the 3-alkylthieno[3,2-b]thiophene and 3,6-diakylthieno[3,2-b]thiophene can be prepared according to literature methods as shown in Scheme 1 (Xinnan Zhang at al. *Macromolecules* 2004, Vol. 37, pp. 6306-6315, the disclosure of which is totally incorporated herein by reference). Bromination of substituted thieno[3,2-b]thiophenes using N-bromosuccinimide (NBS) gives 2,5-dibromo-3-alkylthieno[3,2-b]thiophene and 2,5-dibromo-3,6-dialkylthieno[3,2-b]thiophene, which are polymerized with diboronic acids (or esters) which comprise component B via Suzuki coupling reaction, or with bis(organo)tin compounds which comprise component B via Stille coupling reaction, to produce the respective substituted thieno[3,2-b]thiophene-containing polymer. Scheme 2 outlines the synthesis of polymers (1), (2), (1), and (16). Alternatively, polymer (1) can be prepared via oxidative polymerization of 2,5-bis(2-thienyl)-3-alkylthieo[3,2-b]thiophene or 2,5-bis(2-thienyl)-3,6-dialkylthieo[3,2-b]thiophene using $FeCl_3$, or via Yamamoto-type coupling of 2,5-bis(2-halothienyl)-3-alkylthieo[3,2-b]thiophene or 2,5-bis(2-halothienyl)-3,6-dialkylthieo[3,2-b]thiophene using zinc in the presence of an appropriate catalyst as shown in Scheme 3.

Scheme 1: Synthesis of substituted thieno[3-2-b]thiophenes.

1) 3-Substituted thieno[3,2-b]thiophene

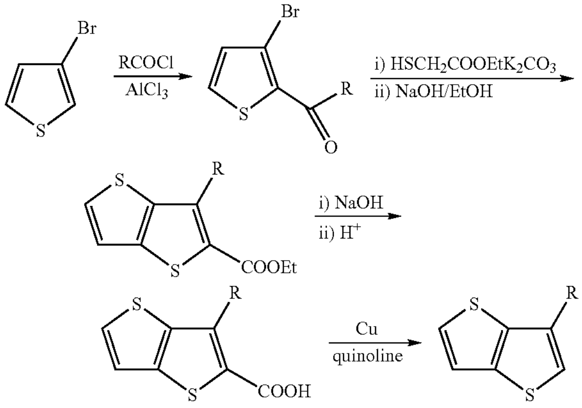

-continued 2) 3,6-Distributed thieno[3,2-b]thiophene

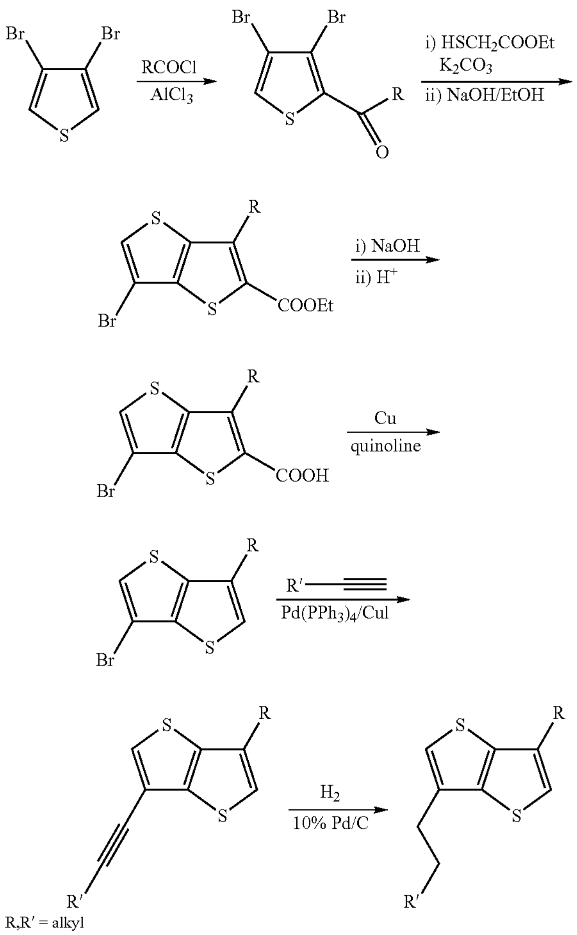

Scheme 2: Synthesis of polymers (1), (2), (11), and (16) via Suzuki or Stille-type coupling polymerization.

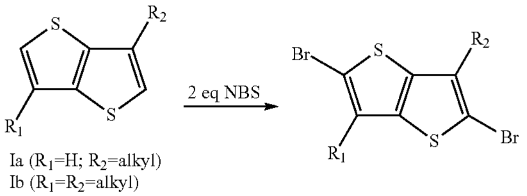

Ia ($R_1$=H; $R_2$=alkyl)
Ib ($R_1$=$R_2$=alkyl)

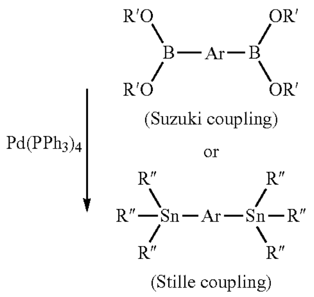

-continued

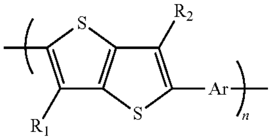

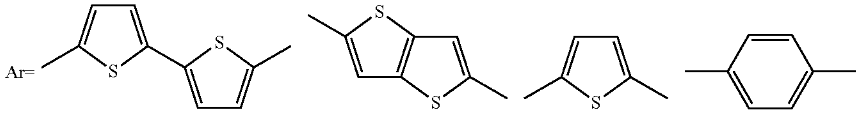

(1) (2) (11) (16)

Scheme 3: Synthesis of polymer (1) via oxidative coupling polymerization with $FeCl_3$ or Yamamoto-type coupling polymerization.

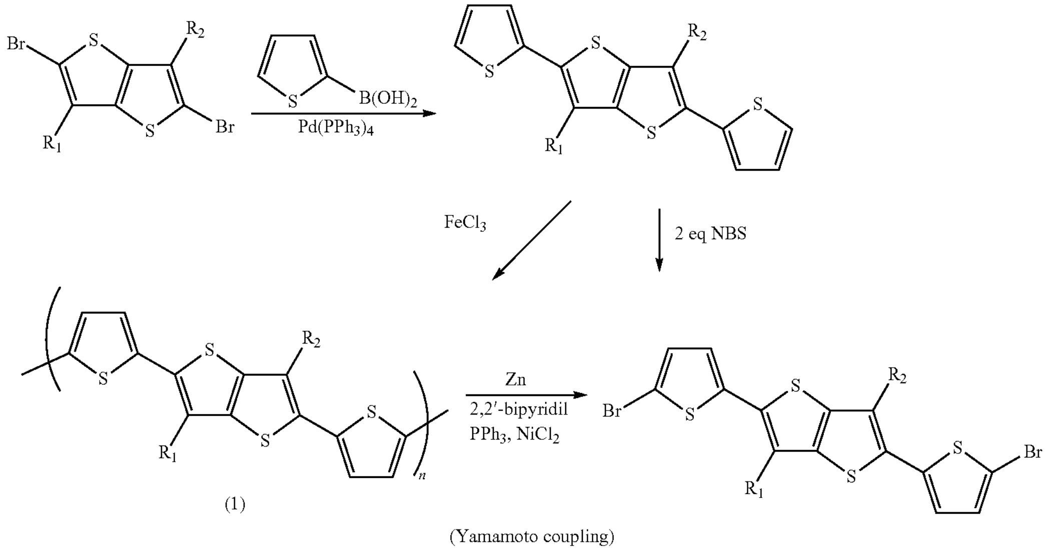

In embodiments, the polymer, which has two or more different types of repeat units can be prepared, for example, by coupling the first polymer which comprises the first repeat unit with another polymer which comprises the second repeat unit, using appropriate chemical reactions. For example, polymer (30) can prepared using a procedure outlined in Scheme 4.

Scheme 4: Synthesis of polymer (30).

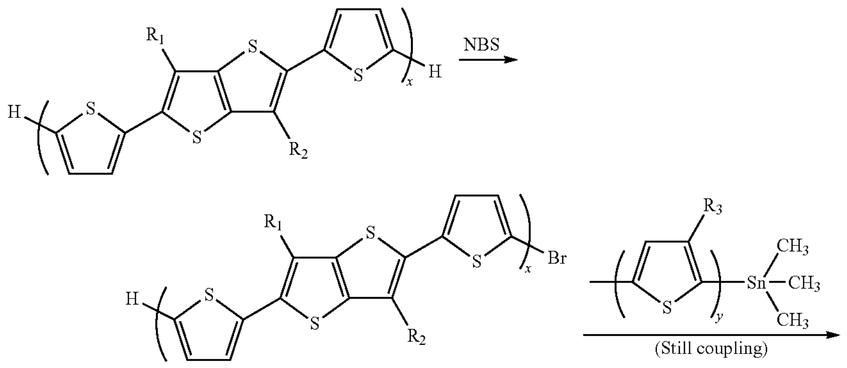

-continued

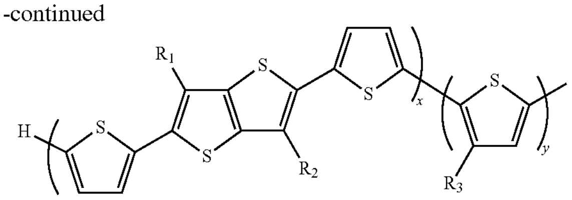

(30)

Any suitable technique may be used to form the semiconductor layer comprising the present polymer. One polymer or a mixture of two or more of the present polymers (in any suitable ratio such as 50:50 by weight) may be used in forming the semiconductor layer. In embodiments, liquid deposition techniques may be used to fabricate the semiconductor layer comprised of the present polymer. Suitable liquid deposition techniques include for example spin coating, blade coating, rod coating, screen printing, ink jet printing, stamping and the like. In embodiments, the present polymer can be dissolved in a suitable solvent of for example tetrahydrofuran, dichloromethane, chlorobenzene, dichlorobenzene, toluene, and xylene, and mixtures thereof, to form a solution at a concentration of about 0.1% to about 30%, particularly about 0.3% to about 5% by weight, and then used in the liquid deposition. Illustrative deposition by spin coating can be carried out at a spin speed of about 500 to about 3000 rpm, particularly about 1000 to about 2000 rpm, for a period of time of about 5 to about 200 seconds, particularly about 30 to about 120 seconds at room temperature or an elevated temperature to form a thin film on a suitable substrate such as silicon wafer, glass, or plastic sheet.

In embodiments, the present polymer can be used in electronic devices such as thin film transistors, diodes and photovoltaic cells. The use of the present polymer as a semiconductor in electronic devices is illustrated herein using thin film transistors.

In FIG. 1, there is schematically illustrated an OTFT configuration 10 comprised of a substrate 16, in contact therewith a metal contact 18 (gate electrode) and a layer of a gate dielectric layer 14 on top of which two metal contacts, source electrode 20 and drain electrode 22, are deposited. Over and between the metal contacts 20 and 22 is an organic semiconductor layer 12 as illustrated herein.

Figure 2:
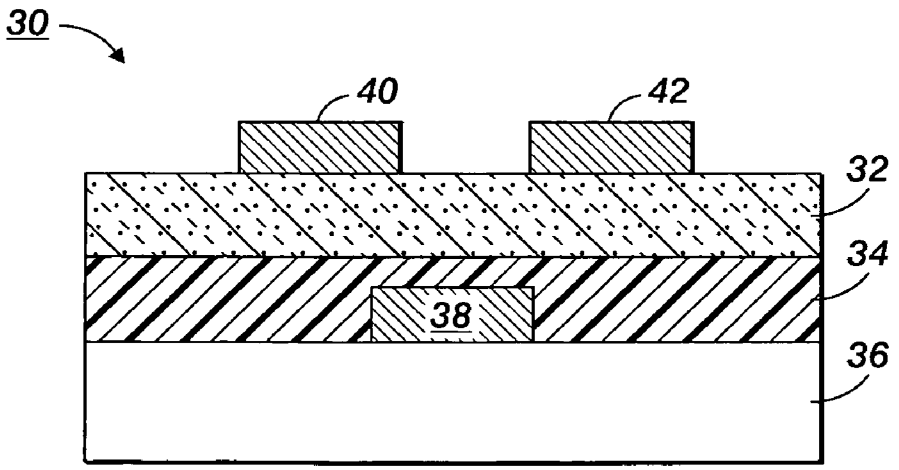
FIG. 2 represents a second embodiment of the present invention in the form of an OTFT.

FIG. 2 schematically illustrates another OTFT configuration 30 comprised of a substrate 36, a gate electrode 38, a source electrode 40 and a drain electrode 42, a gate dielectric layer 34, and an organic semiconductor layer 32.

Figure 3:
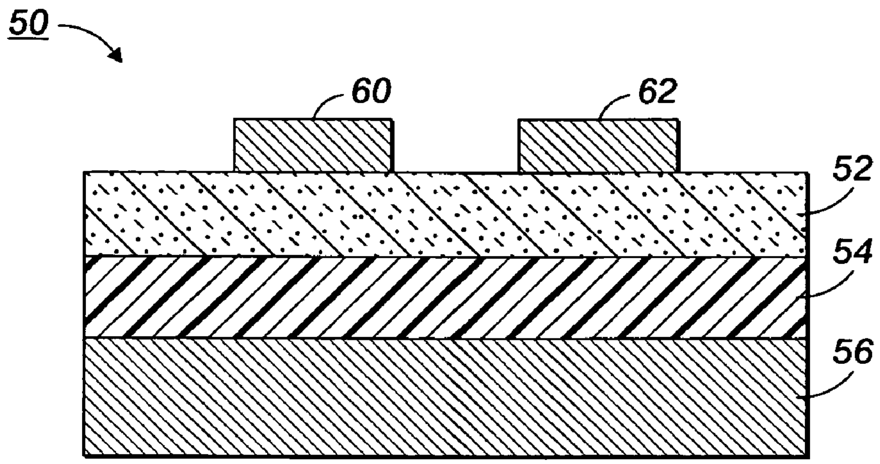
FIG. 3 represents a third embodiment of the present invention in the form of an OTFT.

FIG. 3 schematically illustrates a further OTFT configuration 50 comprised of a heavily n-doped silicon wafer 56 which acts as both a substrate and a gate electrode, a thermally grown silicon oxide gate dielectric layer 54, and an organic semiconductor layer 52, on top of which are deposited a source electrode 60 and a drain electrode 62.

Figure 4:
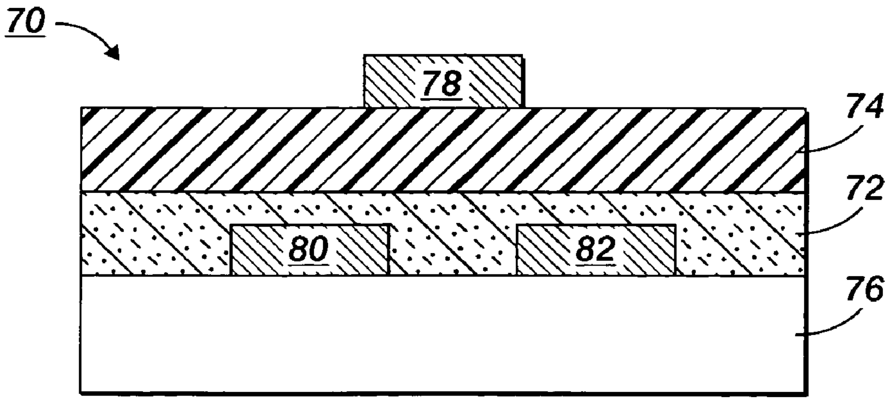
FIG. 4 represents a fourth embodiment of the present invention in the form of an OTFT.

FIG. 4 schematically illustrates an additional OTFT configuration 70 comprised of substrate 76, a gate electrode 78, a source electrode 80, a drain electrode 82, an organic semiconductor layer 72, and a gate dielectric layer 74.

The composition and formation of the semiconductor layer are described herein.

The semiconductor layer has a thickness ranging for example from about 10 nanometers to about 1 micrometer with a preferred thickness of from about 20 to about 200 nanometers. The OTFT devices contain a semiconductor channel with a width, W and length, L. The semiconductor channel width may be, for example, from about 1 micrometers to about 5 millimeters, with a specific channel width being about 5 micrometers to about 1 millimeter. The semiconductor channel length may be, for example, from about 1 micrometer to about 1 millimeter with a more specific channel length being from about 5 micrometers to about 100 micrometers.

The substrate may be composed of for instance silicon, glass plate, plastic film or sheet. For structurally flexible devices, plastic substrate, such as for example polyester, polycarbonate, polyimide sheets and the like may be preferred. The thickness of the substrate may be from about 10 micrometers to over 10 millimeters with an representative thickness being from about 50 to about 100 micrometers, especially for a flexible plastic substrate and from about 1 to about 10 millimeters for a rigid substrate such as glass plate or silicon wafer.

The gate electrode can be a thin metal film, a conducting polymer film, a conducting film made from conducting ink or paste or the substrate itself, for example heavily doped silicon. Examples of gate electrode materials include but are not restricted to aluminum, gold, silver, chromium, indium tin oxide, conducting polymers such as polystyrene sulfonate-doped poly(3,4-ethylenedioxythiophene) (PSS-PEDOT), conducting ink/paste comprised of carbon black/graphite or colloidal silver dispersion in polymer binders, such as ELECTRODAG™ available from Acheson Colloids Company. The gate electrode layer can be prepared by vacuum evaporation, sputtering of metals or conductive metal oxides, coating from conducting polymer solutions or conducting inks by spin coating, casting or printing. The thickness of the gate electrode layer ranges for example from about 10 to about 200 nanometers for metal films and in the range of about 1 to about 10 micrometers for polymer conductors. Typical materials suitable for use as source and drain electrodes include those of the gate electrode materials such as gold, nickel, aluminum, platinum, conducting polymers and conducting inks. Typical thicknesses of source and drain electrodes are about, for example, from about 40 nanometers to about 1 micrometer with the more specific thickness being about 100 to about 400 nanometers.

The gate dielectric layer generally can be an inorganic material film or an organic polymer film. Illustrative examples of inorganic materials suitable as the gate dielectric layer include silicon oxide, silicon nitride, aluminum oxide, barium titanate, barium zirconium titanate and the like; illustrative examples of organic polymers for the gate dielectric layer include polyesters, polycarbonates, poly(vinyl phenol), polyimides, polystyrene, poly(methacrylate)s, poly(acrylate) s, epoxy resin and the like. The thickness of the gate dielectric layer is, for example from about 10 nanometers to about 2000 nanometers depending on the dielectric constant of the dielectric material used. An representative thickness of the gate dielectric layer is from about 100 nanometers to about 500 nanometers. The gate dielectric layer may have a conductivity that is for example less than about $10^{-12}$ S/cm.

In embodiments, the gate dielectric layer, the gate electrode, the semiconductor layer, the source electrode, and the drain electrode are formed in any sequence with the gate electrode and the semiconductor layer both contacting the gate dielectric layer, and the source electrode and the drain electrode both contacting the semiconductor layer. The phrase "in any sequence" includes sequential and simultaneous formation. For example, the source electrode and the drain electrode can be formed simultaneously or sequentially. The composition, fabrication, and operation of field effect transistors are described in Bao et al., U.S. Pat. No. 6,107,117, the disclosure of which is totally incorporated herein by reference.

For a p-channel OTFT, the source electrode is grounded and a bias voltage of generally, for example, about 0 volt to about −80 volts is applied to the drain electrode to collect the charge carriers transported across the semiconductor channel when a voltage of generally about +20 volts to about −80 volts is applied to the gate electrode.

In embodiments, the semiconductor layer incorporating the present polymer in an OTFT device generally exhibits a field-effect mobility of greater than for example about $10^{-3}$ $cm^2/Vs$ (square centimeter per Volt per second), and an on/off ratio of greater than for example about $10^3$. On/off ratio refers to the ratio of the source-drain current when the transistor is on to the source-drain current when the transistor is off.

The invention will now be described in detail with respect to specific representative embodiments thereof, it being understood that these examples are intended to be illustrative only and the invention is not intended to be limited to the materials, conditions, or process parameters recited herein. All percentages and parts are by weight unless otherwise indicated. As used herein, "ambient temperature" and "room temperature" refer to a temperature ranging from about 20 to about 25 degrees C.

EXAMPLE 1

Synthesis and OTFT Performance of poly(3,6-dipentadecylthieno[3,2-b]thiophene-co-bithiophene (1, $R_1$=$R_2$=pentadecyl).

(I) Monomer Synthesis (Scheme 1) and Polymerization (Schemes 2):

(a) 1-(3,4-Dibromothiophene-2-yl)-hexadodecan-1-one: Aluminum chloride (6.27 g, 47 mmol) was added in portions over 30 min to a stirring solution of 3,4-dibromothiophene (12.1 g, 50 mmol) in dichloromethane (50 mL). The resulting mixture was stirred for 3 h at room temperature, followed by slow addition of cold water (50 mL) to quench the reaction. Additional dichloromethane (50 mL) was added to extract the product from the aqueous layer. The combined organic extractions were dried over anhydrous $MgSO_4$, filtered, and the filtrate was vacuum-evaporated to give a white solid product (23.87 g, 99.4%).

(b) 6-Bromo-3-pentadecylthieno[3,2-b]thiophene-2-carboxylic acid ethyl ester: Ethyl thioglycolate (5.82 g, 5.31 mL, 48.4 mmol) was added to a mixture of 1-(3,4-dibromothiophene-2-yl)-hexadodecan-1-one (23.25 g, 48.4 mmol), $K_2CO_3$ (13.38 g, 96.8 mmol), and N,N-dimethylformamide (DMF) (100 mL) at room temperature. After the resulting mixture was stirred for 24 h, a solution of NaOH (0.4 g, 10 mmol) in ethanol (EtOH) (20 mL) was added, and stirring was continued for 24 h. The mixture was poured into aqueous sodium chloride solution (100 mL) and then extracted with ethyl acetate (150 mL). The organic layer was separated and washed with saturated aqueous sodium chloride solution (4×150 mL) and then dried over $MgSO_4$. Filtration and removal of solvent gave a greenish liquid. Yield: 23.87 g (98%).

(c) 6-Bromo-3-pentadecylthieno[3,2-b]thiophene-2-carboxylic acid: A mixture of 6-bromo-3-pentadecylthieno[3,2-b]thiophene-2-carboxylic acid ethyl ester (23.87 g, 47.6 mmol) and NaOH (4 g, 100 mmol) in ethyl alcohol (200 mL) was refluxed for 3 hr. The solvent was removed and water (200 mL) was then added to the residue. The pH was adjusted to 1 with aqueous 10 M HCl solution. The precipitated solid was collected by filtration and recrystallized from hexane (100 mL) to give a white solid. Yield: 21.74 g (97%).

(d) 6-Bromo-3-pentadecylthieno[3,2-b]thiophene: A mixture of 6-bromo-3-pentadecylthieno[3,2-b]thiophene-2-carboxylic acid (21.64 g, 45.7 mmol), copper (1.85 g, 29 mmol), and quinoline (90 mL) was heated to reflux (260° C.) for 1 h. After the removal of solvent by distillation, ethyl acetate (200 mL) was added to dissolve the residue. The resulting solution was washed with aqueous 1M HCl solution (3×200 mL), dried over anhydrous $MgSO_4$, and the using hexane as an eluent to give a viscous liquid (17.69 g). The latter was dissolved in 60 mL of hexane and chilled to −20° C. to give a yellow crystalline product. Yield: 11.79 g (60%).

(e) 6-Pentadecynyl-3-pentadecylthieno[3,2-b]thiophene: To a solution of 1-dodecyl-4-iodobenzene (6.44 g, 15 mmol) and 1-pentadecyne (7.90 g, 37.9 mmol) in triethylamine (100 mL) were added dichlorobis(triphenylphosphine)palladium (II) (0.42 g, 0.6 mmol) and copper(I) iodide (57 mg, 0.3 mmol). The reaction mixture was stirred at 50° C. for 20 h and then at 80° C. 6 h. Solvent removal by evaporation gave a residue which was purified by column chromatography on silica gel using hexane as an eluent. The crude product was recrystallized from hexane to give a white crystal. Yield: 7.09 g (85%).

(f) 3,6-Dipentadecylthieno[3,2-b]thiophene: 10% Pd/C (palladium on carbon powder; 0.64 g, 0.61 mmol) was added to a solution of 6-pentadecynyl-3-pentadecylthieno[3,2-b]thiophene (6.74 g, 12.1 mmol) in ethyl acetate (150 mL), and the resulting mixture was stirred at room temperature under hydrogen atmosphere for 24 h. After the reaction, the reaction mixture was filtered through CELITE™, and additional ethyl acetate (200 mL) was used to elute the product. Solvent removal gave a residue which was recrystallized from hexane to give a white crystal. Yield: 5.17 g (76%).

(g) 2,5-Dibromo-3,6-dipentadecylthieno[3,2-b]thiophene: To a well-stirred suspension of 3,6-dipentadecylthieno[3,2-b]thiophene (4.42 g, 7.87 mmol) in dichloromethane (150 mL) under argon atmosphere was added 50 mL of acetic acid. N-bromosuccinimide (2.80 g, 15.8 mmol) was then added in small portions, and the resulting reaction mixture was stirred at room temperature for 3 hr. After removal of solvent, the residue was washed with water and then recrystallized from toluene. Yield: 4.92 g (87%).

(h) Poly(3,6-dipentadecylthieno[3,2-b]thiophene-co-bithiophene): To a mixture of 2,5-dibromo-3,6-dipentadecylthieno[3,2-b]thiophene (0.819 g, 1.14 mmol) and 2,5'-bis(tributylstannyl)bithiophene) (0.849 g, 1.14 mmol) was added tetrakis(triphenylphosphine)palladium (0) ($Pd(PPh_3)_4$) (42 mg, 0.036 mmol) and anhydrous toluene (20 mL). The mixture was heated to reflux and then stirred for 24 hr. The reaction mixture was cooled to room temperature and poured into 200 mL of stirring methanol containing 20 mL aqueous 10 M HCl solution. The precipitated solid was filtered, washed with methanol, and dried. The solid was purified by Soxhlet extraction using heptane, and then dissolved with toluene. After removing the solvent, a dark red solid was obtained. Yield: 0.67 g (80%).

(II) OTFT Fabrication and Characterization

A top-contact thin film transistor configuration as schematically illustrated in FIG. 3 was selected as our test device structure. The test device was built on an n-doped silicon wafer with a thermally grown silicon oxide layer with a thickness of about 200 nanometers thereon, and had a capacitance of about 15 nF/$cm^2$ (nanofarads/square centimeter), as measured with a capacitor meter. The wafer functioned as the gate electrode while the silicon oxide layer acted as the gate dielectric. The silicon wafer was first cleaned with isopropanol, argon plasma, isopropanol and air dried, and then immersed in a 0.1 M solution of octyltrichlorosilane (OTS-8) in toluene at 60° C. for 20 min. Subsequently, the wafer was washed with toluene, isopropanol and air-dried. A solution of poly(3,6-dipentadecylthieno[3,2-b]thiophene-co-bithiophene) in dichlorobenzene (0.3 percent by weight) was first filtered through a 1.0 micrometer syringe filter, and then spin-coated on the OTS-8-treated silicon wafer at 1000 rpm for 120 seconds at room temperature. This resulted in the formation of a semiconductor layer with a thickness of 20-50 nanometers on the silicon wafer, which was then dried in a vacuum oven at 80° C. for 5-10 h. Subsequently, gold source and drain electrodes of about 50 nanometers in thickness were deposited on top of the semiconductor layer by vacuum deposition through a shadow mask with various channel lengths and widths, thus creating a series of transistors of various dimensions. The devices were annealed at 140° C. for 10-15 min before evaluation.

The evaluation of transistor performance was accomplished in a black box (that is, a closed box which excluded ambient light) at ambient conditions using a Keithley 4200 SCS semiconductor characterization system. The carrier mobility, μ, was calculated from the data in the saturated regime (gate voltage, $VG_1$<source-drain voltage, $V_{SD}$) according to equation (1)

$$I_{SD}=C_i\mu(W/2L)(V_G-V_T)^2 \quad (1)$$

where $I_{SD}$ is the drain current at the saturated regime, W and L are, respectively, the semiconductor channel width and length, $C_i$ is the capacitance per unit area of the gate dielectric layer, and $V_G$ and $V_T$ are, respectively, the gate voltage and threshold voltage. $V_T$ of the device was determined from the relationship between the square root of $I_{SD}$ at the saturated regime and $V_G$ of the device by extrapolating the measured data to $I_{SD}$=0.

The transfer and output characteristics of the devices showed that compound was a p-type semiconductor. Using transistors with a dimension of W=5,000 μm and L=90 μm, the following average properties from at least five transistors were obtained:

Mobility: 0.2 $cm^2$/V.s.

On/off ratio: $10^6$.

EXAMPLE 2

Synthesis and OTFT Performance of poly(3,6-dipentadecylthieno[3,2-b]thiophene-co-thieno[3,2-b]thiophene) (1, $R_1$=$R_2$=dodecyl)

(I) Poly(3,6-didodecylthieno[3,2-b]thiophene-co-bithiophene) (Scheme 2):

A well-stirred mixture of 2,5-dibromo-3,6-didodecylthieno[3,2-b]thiophene (0.3173 g, 0.5 mmol), 2,5-bis(trimethylstannyl)thieno[3,2-b]thiophene (0.2459 g, 0.5 mmol), $Pd(PPh_3)_4$ (18 mg, 0.015 mmol) and anhydrous toluene (10 mL) in a flask was heated under reflux for 24 hr. The reaction mixture was cooled to room temperature and then poured into 200 mL of stirring methanol containing 20 mL aqueous 10 M HCl solution. The precipitated solid was filtered, washed with methanol, and dried. The solid was then purified by Soxhlet extraction using heptane, and then dissolved with chloroform. After removing the solvent, a dark red solid was obtained. Yield: 0.31 g (97%).

(II) OTFT Fabrication and Characterization

OTFT devices using poly(3,6-didodecylthieno[3,2-b]thiophene-co-bithiophene) as the semiconductor were fabricated and characterized in accordance with the procedures of Example 1. Using transistors with a dimension of W=5,000 μm and L=90 μm, the following average properties from at least five transistors were obtained:

Mobility: 0.12 $cm^2$/V.s

On/off ratio: $10^6$.

The above results show that the present polymers which can be prepared readily serve as excellent semiconductors for electronic devices. Specifically, for use as p-channel semiconductors in OTFTs, the present polymers have provided high mobility and current on/off ratio as demonstrated in the above examples.

The invention claimed is:

1. An electronic device comprising a polymer comprising one or more repeat units, wherein the polymer comprises a substituted thieno[3,2-b]thiophene component A and a different component B, components A and B being in the same repeat unit or in different repeat units, and wherein the polymer excludes a substituted or unsubstituted thieno[2,3-b]thiophene moiety, wherein component B is an aromatic moiety, and wherein components A and B are both in the backbone of the polymer.

2. The electronic device of claim 1, wherein the substituted thieno[3,2-b]thiophene component A is of formula (I):

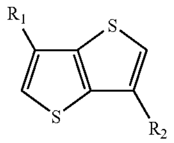

(I)

wherein one of $R_1$ and $R_2$ is hydrogen and the other is a substituent, or both $R_1$ and $R_2$ are the same or different substituent, wherein the substituent is independently selected from the group consisting of an optionally substituted hydrocarbon group, a heteroatom-containing group, and a halogen.

3. The electronic device of claim 1, wherein the component B is a thieno[3,2-b]thiophene of formula (II):

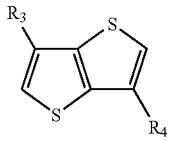

(II)

wherein $R_3$ and $R_4$ are independently selected from the group consisting of a hydrogen atom, an optionally substituted hydrocarbon group, a heteroatom-containing group, and a halogen.

4. The electronic device of claim 1, wherein the component A and the component B are in the same unit.
5. The electronic device of claim 1, wherein the component B is conjugated.
6. The electronic device of claim 1, wherein the polymer is a regioregular polymer.
7. The electronic device of claim 1, wherein the polymer is selected from the group consisting of:
(1)
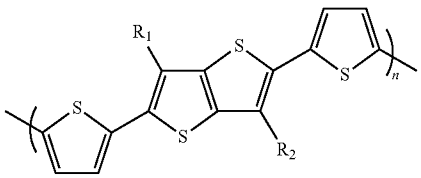
(2)
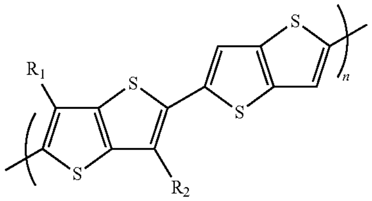
(3)
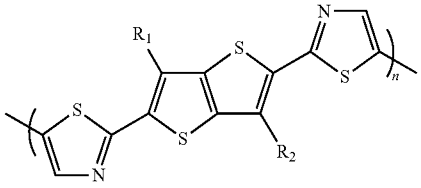
(4)
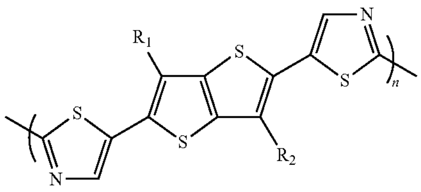
(5)
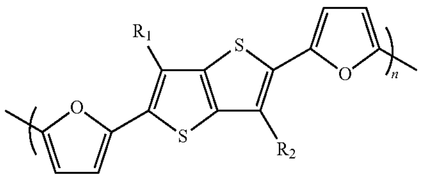
(6)
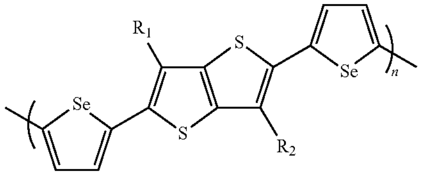
(7)
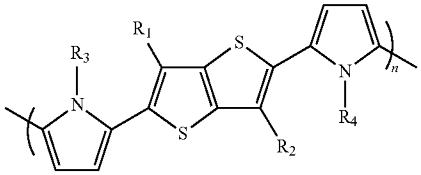
-continued
(8)
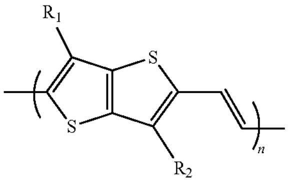
(9)
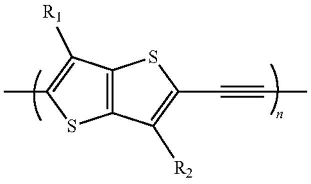
(10)
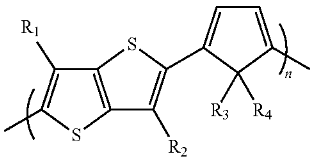
(11)
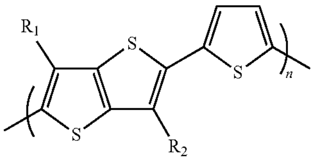
(12)
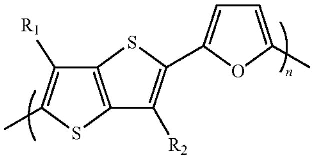
(13)
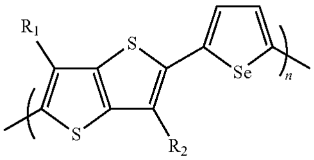
(14)
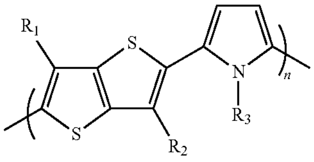
(15)
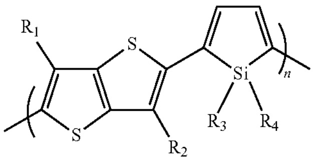
(16)
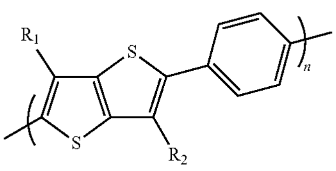

-continued (17)

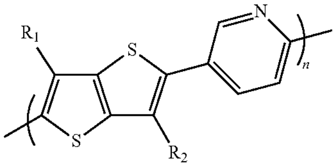

(18)

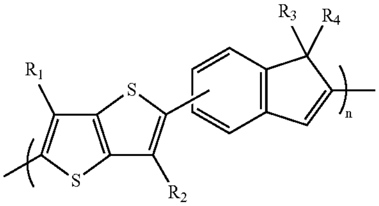

(19)

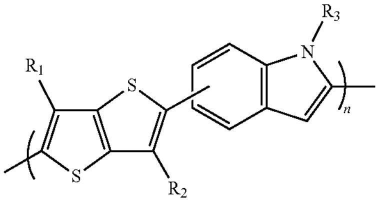

(20)

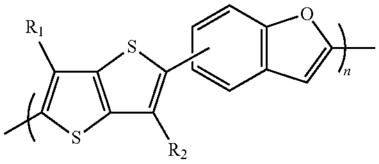

(21)

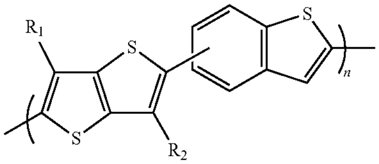

(22)

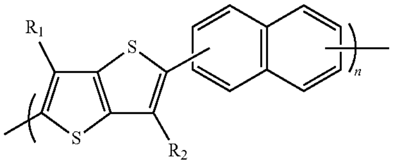

(23)

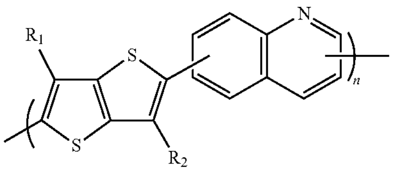

(24)

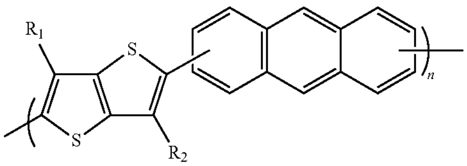

-continued (25)

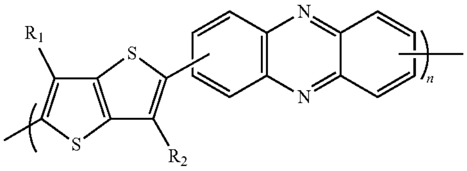

(26)

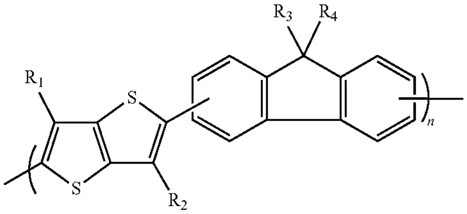

(27)

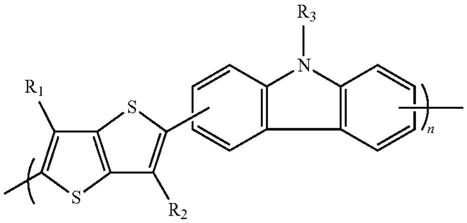

(28)

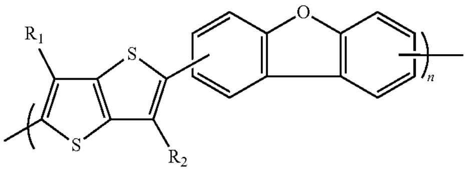

(29)

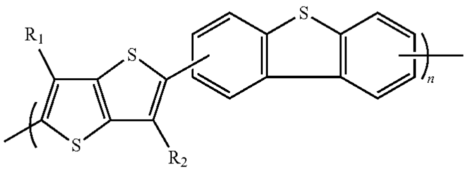

and mixtures thereof, wherein n is the number of repeat units;

wherein one of $R_1$ and $R_2$ is hydrogen and the other is a substituent, or both $R_1$ and $R_2$ are the same or different substituent, and wherein the substituent is independently selected from the group consisting of an optionally substituted hydrocarbon group, a heteroatom-containing group, and a halogen; and wherein $R_3$ and $R_4$ are independently selected from the group consisting of a hydrogen atom, an optionally substituted hydrocarbon group, a heteroatom-containing group, and a halogen.

8. The electronic device of claim 1, wherein the polymer is selected from the group consisting of:

(1)

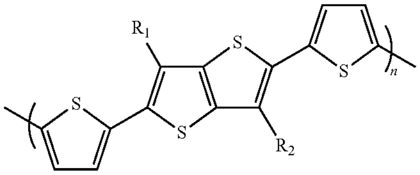

-continued (2)

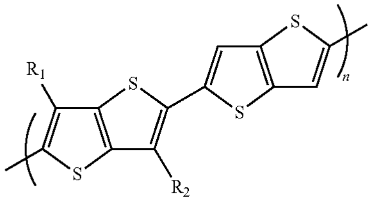

(3)

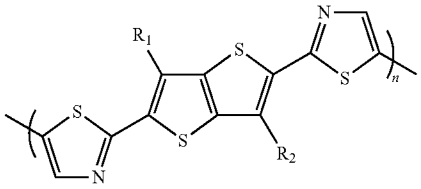

(4)

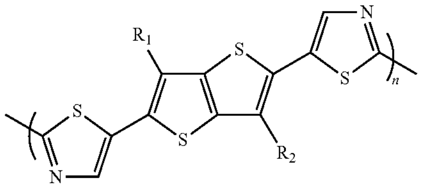

(5)

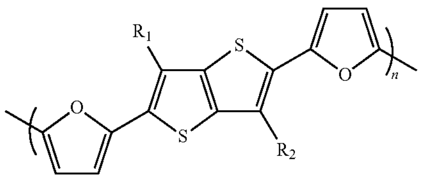

(6)

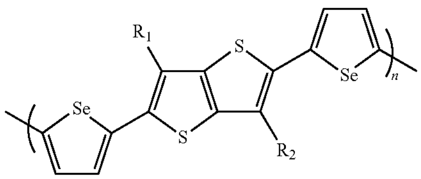

(7)

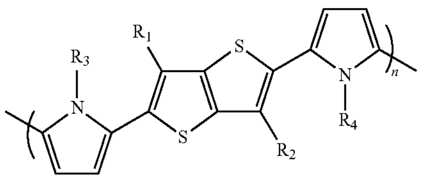

and mixtures thereof, wherein n is the number of repeat units;

wherein one of $R_1$ and $R_2$ is hydrogen and the other is a substituent, or both $R_1$ and $R_2$ are the same or different substituent, and wherein the substituent is independently selected from the group consisting of an optionally substituted hydrocarbon group, a heteroatom-containing group, and a halogen; and wherein $R_3$ and $R_4$ are independently selected from the group consisting of a hydrogen atom, an optionally substituted hydrocarbon group, a heteroatom-containing group, and a halogen.

9. The electronic device of claim 1, wherein the polymer is:

(1)

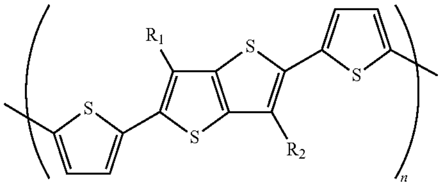

wherein one of $R_1$ and $R_2$ is hydrogen and the other is a substituent, or both $R_1$ and $R_2$ are the same or different substituent, and wherein the substituent is independently selected from the group consisting of an optionally substituted hydrocarbon group, a heteroatom-containing group, and a halogen.

10. The electronic device of claim 1, wherein the polymer is:

(2)

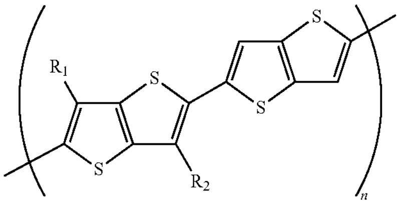

wherein n is the number of repeat units; and wherein one of $R_1$ and $R_2$ is hydrogen and the other is a substituent, or both $R_1$ and $R_2$ are the same or different substituent, wherein the substituent is independently selected from the group consisting of an optionally substituted hydrocarbon group, a heteroatom-containing group, and a halogen.

11. The electronic device of claim 1, wherein the polymer is a block polymer.

12. The electronic device of claim 11, wherein the block polymer is selected from the group consisting of:

(30)

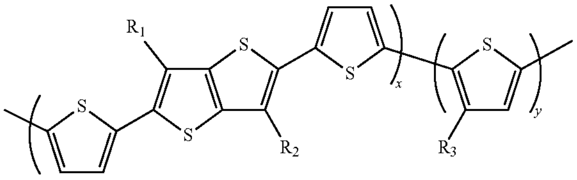

(31)

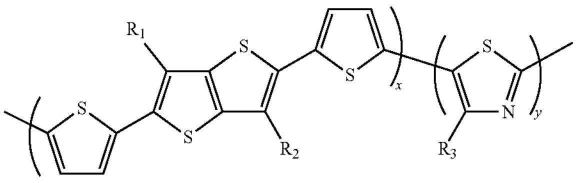

-continued (32)

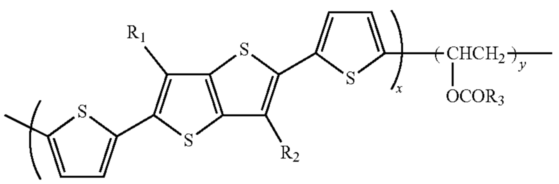

(33)

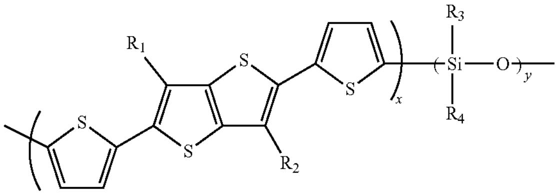

(34)

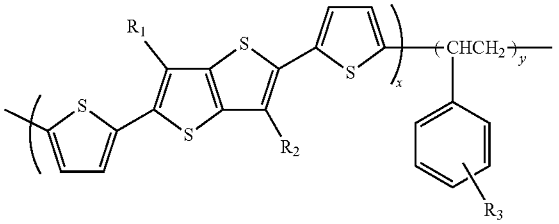

(35)

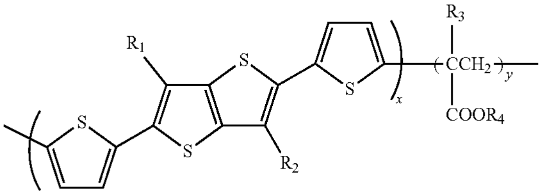

and mixtures thereof, wherein x and y are the number of repeat units in the respective blocks, and are the same or different from each other;

wherein one of $R_1$ and $R_2$ is hydrogen and the other is a substituent, or both $R_1$ and $R_2$ are the same or different substituent, and wherein the substituent is independently selected from the group consisting of an optionally substituted hydrocarbon group, a heteroatom-containing group, and a halogen; and wherein $R_3$ and $R_4$ are independently selected from the group consisting of a hydrogen atom, an optionally substituted hydrocarbon group, a heteroatom-containing group, and a halogen.

13. An electronic device comprising a polymer of formula (9):

(9)

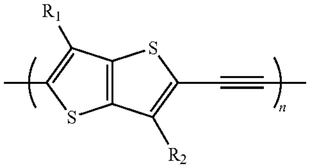

wherein n is the number of repeat units; and wherein one of $R_1$ and $R_2$ is hydrogen and the other is a substituent, or both $R_1$ and $R_2$ are the same or different substituent, and wherein the substituent is independently selected from the group consisting of an optionally substituted hydrocarbon group, a heteroatom-containing group, and a halogen.

* * * * *

UNITED STATES PATENT AND TRADEMARK OFFICE

CERTIFICATE OF CORRECTION

PATENT NO. : 7,919,573 B2
APPLICATION NO. : 11/280119
DATED : April 5, 2011
INVENTOR(S) : Li et al.

It is certified that error appears in the above-identified patent and that said Letters Patent is hereby corrected as shown below:

On the Title Page:
Item (74) Attorney, Agent, or Firm should appear as follows:

Zosan S. Soong; Fay Sharpe LLP

Signed and Sealed this
Seventeenth Day of May, 2011

David J. Kappos
*Director of the United States Patent and Trademark Office*

UNITED STATES PATENT AND TRADEMARK OFFICE

CERTIFICATE OF CORRECTION

PATENT NO. : 7,919,573 B2
APPLICATION NO. : 11/280119
DATED : April 5, 2011
INVENTOR(S) : Yuning Li et al.

It is certified that error appears in the above-identified patent and that said Letters Patent is hereby corrected as shown below:

In the Specification:

Column 1, line 5, after “Cooperative Agreement No.”, please delete “70NANBOH3033” and insert -- 70NANB0H3033 --.

Signed and Sealed this
Tenth Day of September, 2013

Teresa Stanek Rea
*Acting Director of the United States Patent and Trademark Office*